US006911096B2

(12) United States Patent
Watanabe

(10) Patent No.: US 6,911,096 B2
(45) Date of Patent: Jun. 28, 2005

(54) METHOD OF COLLECTING IMPURITIES ON SURFACE OF SEMICONDUCTOR WAFER

(75) Inventor: Kaori Watanabe, Kanagawa (JP)

(73) Assignee: NEC Electronics Corporation (JP)

( * ) Notice: Subject to any disclaimer, the term of this patent is extended or adjusted under 35 U.S.C. 154(b) by 375 days.

(21) Appl. No.: 10/288,768

(22) Filed: Nov. 6, 2002

(65) Prior Publication Data

US 2003/0084926 A1 May 8, 2003

(30) Foreign Application Priority Data

Nov. 7, 2001 (JP) ....................................... 2001-341531

(51) Int. Cl.[7] .................................................. C23G 1/36

(52) U.S. Cl. ............................. 134/10; 134/13; 134/32; 134/33; 134/34; 438/906

(58) Field of Search ............................. 134/10, 13, 32, 134/33, 34; 438/906

(56) References Cited

FOREIGN PATENT DOCUMENTS

JP 05-082495 4/1993 ......... H01L/21/304
JP 05-283498 10/1993 ........... H01L/21/66
JP 11-142827 * 5/1999

* cited by examiner

*Primary Examiner*—Michael Kornakov
(74) *Attorney, Agent, or Firm*—Hayes Soloway P.C.

(57) ABSTRACT

A method of collecting impurities existing on the surface of a semiconductor wafer and in a thin film formed on the semiconductor wafer is provided with a process for dripping collecting liquid on the surface of the semiconductor wafer to which hydrophobic processing is applied, a process for elongating the collecting liquid dripped and turned spherical by surface tension in a direction of the radius of the semiconductor wafer with the surface tension kept, a process for relatively rolling and scanning the elongated collecting liquid, touching the collecting liquid to the surface of the semiconductor wafer and incorporating impurities into the collecting liquid, a process for restoring the elongated collecting liquid to the original spherical shape after the impurities are incorporated and a process for withdrawing the collecting liquid restored to the spherical shape from the surface of the semiconductor wafer.

9 Claims, 3 Drawing Sheets

6 A 2 1 6 C B 2a 1 6 2a 3 1 2 2a 3 D 6 1 α 6 1 E 2a

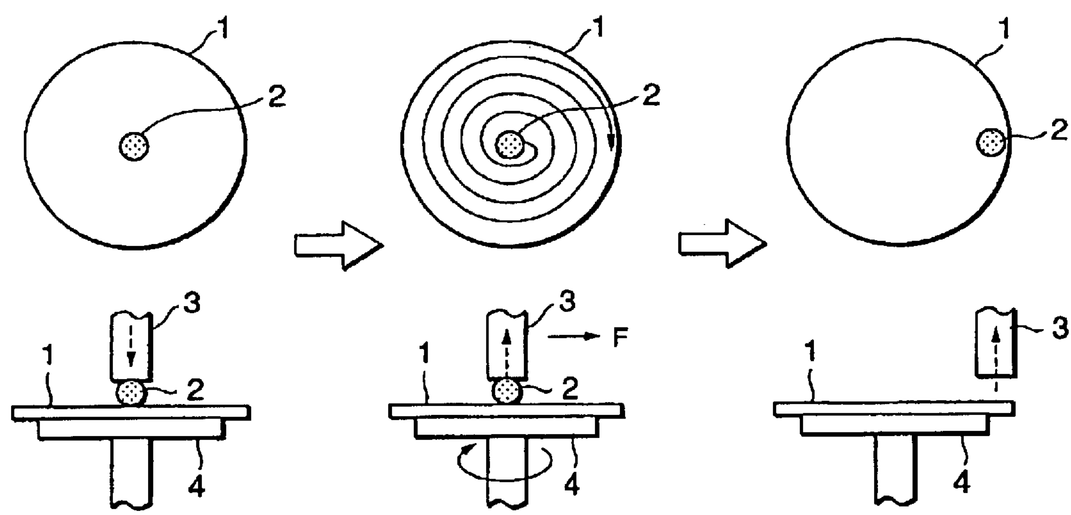
FIG. 4A
Prior Art
FIG. 4B
Prior Art
FIG. 4C
Prior Art
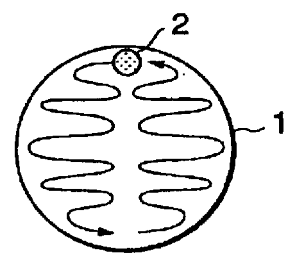
FIG. 5
Prior Art

METHOD OF COLLECTING IMPURITIES ON SURFACE OF SEMICONDUCTOR WAFER

BACKGROUND OF THE INVENTION

1. Field of the Invention

The present invention relates to a method of collecting impurities on the surface of a semiconductor wafer for collecting a tiny amount of impurities existing on the surface of the semiconductor wafer and in a thin film formed on the semiconductor wafer and analyzing the impurities.

2. Description of the Prior Art

In a conventional type manufacturing process of a semiconductor wafer, it is required to advance a process, always monitoring a contaminated state of the surface of the semiconductor wafer. Particularly, when contamination due to metal impurities occurs, the increase of leakage current and the deterioration of withstand pressure are caused and the reliability of a device is largely damaged. Then, to investigate the extent of contamination, inspection that metal impurities are collected from the surface of a semiconductor wafer, are chemically analyzed and the type and quantity of the metal impurities are specified is made. At this time, there is also a measuring method by total reflection fluorescent X-ray spectroscopy (TXRF) in which metal impurities are not required to be collected, however, as this method has an element such as Al and Na which cannot be analyzed or an element which is not satisfactory in sensitivity, a method of collecting and chemically analyzing is required.

For the method of collecting metal impurities, as disclosed in Japanese published unexamined patent application No. Hei5-283498 or No. Hei5-82495 for example, a method of dripping liquid to be collecting liquid on the surface of an inspected semiconductor wafer, scanning this droplet touching the droplet to the surface of the semiconductor wafer with the droplet kept spherical utilizing surface tension, incorporating metal impurities existing on the surface of the semiconductor wafer into the droplet and withdrawing the droplet is used.

Referring to process drawings shown in FIG. 4, an example of the conventional type collecting method will be described below. FIGS. 4A, 4B and 4C show a collecting process viewed from the top and from the side.

First, metal impurities existing on the surface of a semiconductor wafer to be inspected are dissolved by the vapor of hydrogen fluoride (HF) (a VPD process) and the surface of the semiconductor wafer is turned into a hydrophobic state. Next, as shown in FIG. 4A, the semiconductor wafer 1 is horizontally fixed on a rotating table 4 using a vacuum chuck, a syringe 3 made of Teflon (a registered trademark) is touched to the surface of the semiconductor wafer 1 from the upside so that the syringe is perpendicular to the surface of the semiconductor wafer 1 and collecting liquid is dripped from the end of the syringe 3 to the center of the semiconductor wafer 1. At this time, suitable space is left between the end of the syringe 3 and the surface of the semiconductor wafer 1 to prevent the syringe and the semiconductor wafer from coming in contact, a dripped droplet 2 is kept spherical by the end of the syringe 3, keeping surface tension and the syringe 3 supports the droplet 2. For the collecting liquid, liquid such as HF, solution acquired by mixing HF and $H_2O_2$ and pure water which is touched to the surface of the semiconductor wafer in a hydrophobic state and can acquire sufficient surface tension is used. As described above, the droplet 2 of collecting liquid dripped from the syringe 3 is put between the syringe 3 and the semiconductor wafer 1 as it is and the spherical shape is maintained by the surface tension.

Next, as shown in FIG. 4B, the droplet 2 draws a spiral locus from the center toward the periphery, coming in contact with the surface of the semiconductor wafer 1 in a spherical state and is scanned by turning the semiconductor wafer 1 with the center as the center of turning in a state in which the droplet 2 is put between the semiconductor wafer and the syringe and simultaneously moving the syringe 3 in the radial direction (in a direction shown by an arrow F) of the semiconductor wafer 1 as it is. As a result, metal impurities existing on the whole surface of the semiconductor wafer are incorporated in the droplet without exception. After the scan is finished, the droplet 2 is attracted and withdrawn by the syringe 3 this time as shown in FIG. 4C. Operation from dripping the collecting liquid till withdrawing it is often executed using an automated apparatus, however, the operation is also made manually. In that case, a silicon substrate chip (split into a square 2 to 3 cm long) is used to withdraw the droplet, for example, the droplet 2 is rolled on the surface of the semiconductor wafer 1, drawing a locus shown in a plan in FIG. 5 and is withdrawn.

However, the conventional type collecting method has the following problems. A first problem is that a collecting process takes very long time. For the reason, the amount of the collecting liquid is set to 0.5 ml or less, that is, a small value to collect metal impurities at as high sensitivity as possible, therefore, the size of the droplet becomes small and area in which the semiconductor wafer and the collecting liquid are touched is reduced, scanned distance is extended by the quantity and it takes much time to scan.

As the size of the droplet is small, the surface tension cannot be kept unless the droplet is scanned at low speed, the droplet is split in pieces and it becomes difficult to collect all liquid. In a manual case, the droplet may drop from the edge of the semiconductor wafer in withdrawing the droplet. Further, when scanning and withdrawing time is extended, contamination from ambient atmosphere and the volatilization of collecting liquid may be caused and as the diameter of the semiconductor wafer is increased, the problems have been serious.

BRIEF SUMMARY OF THE INVENTION

Summary of the Invention

A method of collecting impurities existing on the surface of a semiconductor wafer and in a thin film formed on the semiconductor wafer is provided with a process for dripping collecting liquid on the surface of the semiconductor wafer to which hydrophobic processing is applied, a process for elongating the collecting liquid which is dripped and becomes spherical by surface tension in the radial direction of the semiconductor wafer in a state in which the surface tension is maintained, a process for relatively rolling and scanning the elongated collecting liquid, touching it to the surface of the semiconductor wafer and incorporating impurities into the collecting liquid, a process for restoring the elongated collecting liquid to the original spherical shape after the impurities are incorporated and a process for withdrawing the collecting liquid restored to the spherical shape from the surface of the semiconductor wafer.

BRIEF DESCRIPTION OF THE DRAWINGS

The above-mentioned and other objects, features and advantages of this invention will become more apparent by reference to the following detailed description of the invention taken in conjunction with the accompanying drawings, wherein:

FIGS. 4A to 4C are process drawings for explaining a conventional type impurities collecting method; and FIG. 5 is a plan showing an example of a conventional scanned locus.

DETAILED DESCRIPTION OF THE INVENTION

Figure 2:
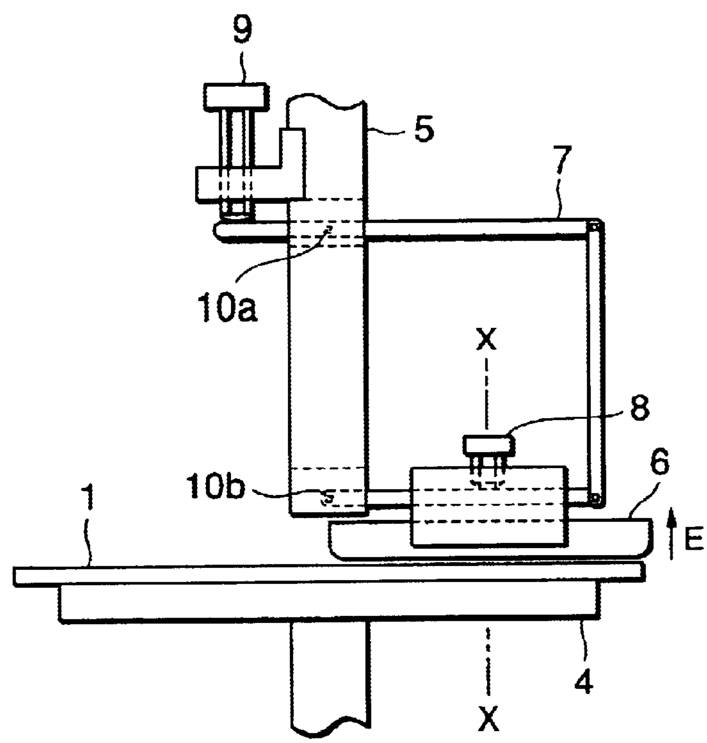
FIG. 2 is a front view for explaining an impurities collecting apparatus used for the one embodiment of the invention.

Next, referring to the drawings, an embodiment of the invention will be described. FIG. 2 is a front view showing the schematic structure of an apparatus for collecting impurities on the surface of a semiconductor wafer used in one embodiment of the invention and FIG. 3 is a sectional view viewed along a line X—X in FIG. 2.

As shown in FIG. 2, a rotating table 4 on which a semiconductor wafer 1 to be inspected is horizontally laid and is fixed by a vacuum chuck and which can be moved in directions of the x-, y- and z-axes, a vertical rotating shaft 5 installed above the rotating table 4 and a scanning plate 6 attached to a link mechanism 7 provided in a lower part of the vertical rotating shaft 5 are provided. The link mechanism 7 is attached to the vertical rotating shaft 5 at rotation supporting points 10$a$ and 10$b$. The scanning plate 6 is formed so that the length is equivalent to the radius of the semiconductor wafer 1 or is slightly longer (for example, 155 mm in the case of a wafer having a diameter of 300 mm) and is attached to the link mechanism 7 in a state in which the scanning plate is put close to the semiconductor wafer via slight clearance to the extent that the scanning plate is not touched to the surface of the semiconductor wafer 1 or is lightly touched. The scanning plate 6 can rotate and scan the whole surface of the semiconductor wafer 1 by aligning the center of the semiconductor wafer 1 laid on the rotating table 4 with the axis of the vertical rotating shaft 5 and relatively rotating the semiconductor wafer 1 and the scanning plate 6.

Figure 3:
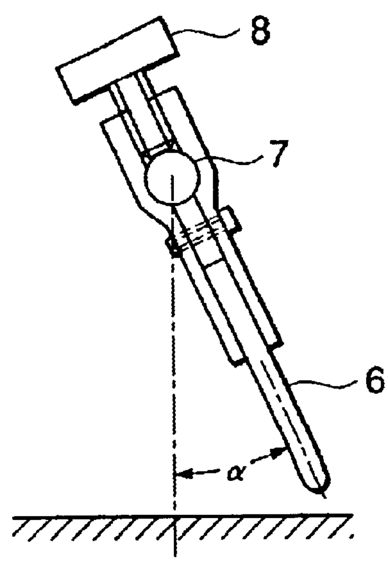
FIG. 3 is a sectional view viewed along a line X—X in FIG. 2.

As shown in FIG. 3, after the scanning plate 6 is set at a desired inclination $\alpha$, it is fixed to the link mechanism 7 by a fixing screw 8. As shown in FIG. 2, the scanning plate 6 is operated by an adjusting screw 9 so that the end can be turned in a direction in which the end is gradually lifted (in a direction shown by an arrow E) by the turn of the link mechanism 7. The link mechanism 7 tries to turn in a direction reverse to the direction shown by the arrow E because of the self-weight, however, the link mechanism is locked by the adjusting screw 9 and the turning angle in a direction shown by an arrow D or the rotational speed cab be adjusted by turning the adjusting screw 9. The scanning plate 6 can be detached from the link mechanism 7 and it is desirable that some types are prepared to vary the length according to the size of a semiconductor wafer. For the material of the scanning plate 6, it is desirable that the scanning plate is made of material in which a hydrophobic surface is acquired such as a silicon substrate and Teflon (the registered trademark) resin. Though a collecting apparatus according to the invention is not shown, it is provided with a syringe for dripping and attracting collecting liquid on/from a semiconductor wafer in addition to the mechanism.

Figures 1A, 1B, 1C:
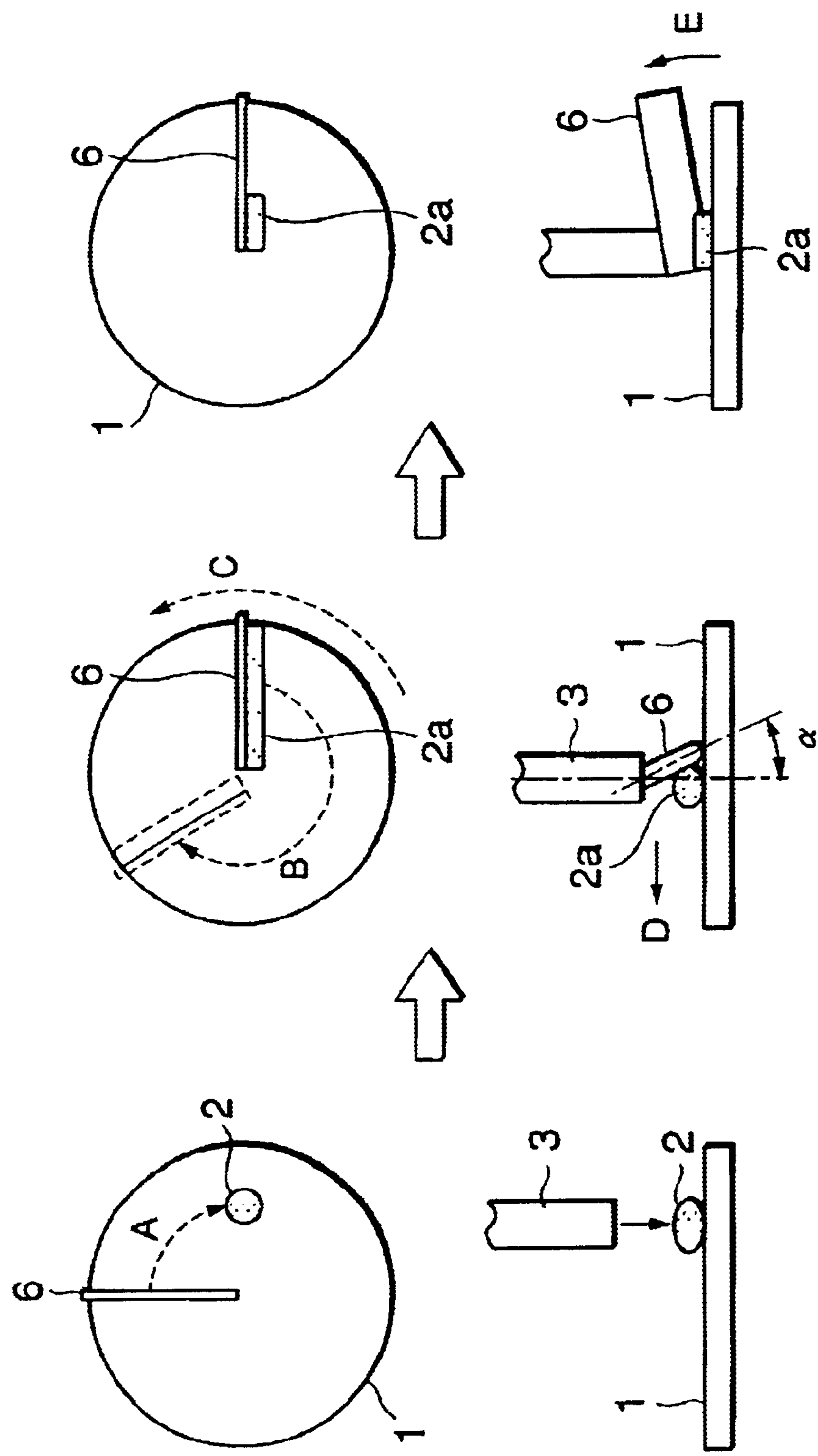
FIGS. 1A to 1C are process drawings for explaining a method of collecting impurities equivalent to one embodiment of the invention.

Next, referring to process drawings shown in FIGS. 1A, 1B and 1C, a collecting method equivalent to one embodiment of the invention of using such a collecting apparatus will be described. FIGS. 1A, 1B and 1C show a collecting process viewed from the top and from the side.

First, as in the conventional type, prior to dripping collecting liquid, metal impurities existing on the surface of the inspected semiconductor wafer are dissolved (a VPD process) by the vapor of HF to turn the surface of the semiconductor wafer hydrophobic. Next, as shown in FIG. 1A, the semiconductor wafer 1 is horizontally fixed on the rotating table 4 by the vacuum chuck. Collecting liquid is dripped in the vicinity of the substantially middle in the radius of the surface of the semiconductor wafer 1 by 0.5 to 3 ml from the syringe 3. For the collecting liquid, as in the conventional type, liquid such as HF, solution acquired by mixing HF and $H_2O_2$ and pure water the surface tension of which is acquired is used. The dripped collecting liquid is turned into a spherical droplet 2 by surface tension and stays on the surface of the semiconductor wafer 1. The syringe 3 is withdrawn after it drips the collecting liquid. The scanning plate 6 the length of which is equivalent to the radius of the semiconductor wafer 1 or is slightly longer is turned in a direction shown by an arrow A by rotating the vertical rotating shaft, is pressed and touched on/to the droplet 2 from the side. The scanning plate 6 is put in parallel with and close to the surface of the semiconductor wafer 1 via slight clearance to the extent that the scanning plate and the surface of the semiconductor wafer 1 are not touched or is lightly touched to the surface of the semiconductor wafer.

For a reason why the scanning plate may be also lightly touched to the semiconductor wafer, it can be listed that in case an irregular surface such as the back of a semiconductor wafer is scanned, a light touch facilitates collecting and as for a semiconductor wafer for analysis, a different wafer from an actual wafer for a device is often used, damage because the scanning plate is lightly touched causes no trouble.

Next, as shown in FIG. 1B, at the same time as the scanning plate 6 and the droplet 2 are touched, the spherical shape of the droplet 2 is deformed, the droplet is elongated to the full length of the radius of the semiconductor wafer 1 along a boundary between the scanning plate 6 and the surface of the semiconductor wafer 1 in a state in which the surface tension is maintained and an elongated droplet 2$a$ is formed. At this time, the scanning plate 6 does not make a right angle with the surface of the semiconductor wafer 1 and if the scanning plate is inclined as if it covered the elongated droplet 2$a$ so that an inclination $\alpha$ with a direction D of a scan is in a range of 10 to 45°, the scanning plate can easily support the elongated droplet 2$a$. The inclination $\alpha$ is set to an optimum angle according to a collecting condition in consideration of the results of experiments and the scanning plate is fixed to the link mechanism 7 by the fixing screw 8 as shown in FIG. 3. The elongated droplet 2$a$ is uniformly touched to the surface of the semiconductor wafer 1 in a state in which the droplet is united by surface tension even if the droplet is elongated and never falls from the edge of the semiconductor wafer 1.

Next, as similarly shown in FIG. 1B, the elongated droplet 2$a$ elongated in the full radius of the semiconductor wafer 1 along the scanning plate 6 is scanned on the whole surface of the semiconductor wafer 1, being pressed by the scanning plate 6. For the scan, the whole surface of the semiconductor wafer 1 is scanned by the elongated droplet 2$a$ by rotating only the scanning plate 6 in a direction shown by an arrow B, rotating only the semiconductor wafer 1 in a direction shown by an arrow C or slowly rotating both the scanning plate 6 and the semiconductor wafer 1. The scanning plate 6 is rotated by rotating the vertical rotating shaft 5 of the collecting apparatus shown in FIG. 2 and the semiconductor wafer 1 is rotated by rotating the rotating table 4 of the collecting apparatus.

Next, as shown in FIG. 1C, when the scanning of the whole surface of the semiconductor wafer 1 is finished, the scanning plate 6 is turned by degrees, being slowly lifted in the direction shown by the arrow E from the side of the edge of the semiconductor wafer. The turning is performed by moving the link mechanism 7 by turning the adjusting screw 9 of the collecting apparatus shown in FIG. 2 by degrees. That is, the scanning plate 6 is turned around the supporting point 10*b* provided to the vertical rotating shaft 5 of the collecting apparatus. The scanning plate 6 is gradually separated from the surface of the semiconductor wafer 1 by turning the scanning plate 6, accordingly the elongated droplet 2*a* is reduced from the side of the edge of the semiconductor wafer and is moved in a central direction of the surface of the semiconductor wafer 1.

As a result, the collecting liquid that finishes scanning is gradually moved on the central side of the semiconductor wafer by surface tension and is restored from the elongated shape to the original shape. The droplet 2 of the collecting liquid moved in the vicinity of the center of the semiconductor wafer 1 is withdrawn by a well-known attracting method or a silicon substrate chip. According to the invention, area in which the droplet is touched to the surface of the semiconductor wafer is expanded by elongating the collecting liquid and as the droplet is rolled and scanned in a state in which the droplet is elongated, scanning and collecting are facilitated. As the surface tension functions even if the collecting liquid is elongated, the collecting liquid never falls from the edge of the semiconductor wafer.

When the collecting liquid withdrawn as described above is analyzed, the metal density is measured using a chemical analyzer according to atomic absorption spectrochemical analysis (AAS) and such as an inductively coupled plasma mass spectrograph (ICP-MS). Or the semiconductor wafer is dried in a state in which the collecting liquid is laid on the semiconductor wafer without being withdrawn after scanning, the collecting liquid is concentrated and can be also measured according to total reflection X-ray fluorescence analysis (TXRF). In the invention, the collecting liquid is required to be slightly increased because it is elongated, however, in case the deterioration of sensitivity is considered because the amount of the collecting liquid is increased, it is desirable that the method of drying and concentrating the collecting liquid is used. However, as the sensitivity of ICP-MS is high, the sensitivity of $1\times10^{10}$ atoms/cm$^2$ or more can be easily acquired in the collecting liquid of a few ml without drying and concentration.

Next, a concrete example of the one embodiment will be described. In a first concrete example, it is verified by an experiment how much ratio of collecting is acquired by measuring the density of metal impurities using the collecting apparatus and the collecting method according to the invention. First, a bare wafer having a diameter of 30 mm is prepared and the surface is forcedly contaminated by Fe and Al by spin coating so that they respectively include $1\times10^{12}$ atoms/cm$^2$. The ratio of collecting based upon the result of measurement is calculated based upon the well-known ratio of contamination.

Next, in case the contaminated bare wafer is inspected, first, Fe and Al which are metal impurities existing on the surface of the prepared bare wafer are dissolved (the VPD process) by the vapor of HF as in the conventional type and the surface of the bare wafer is turned hydrophobic. Next, the bare wafer is laid on the collecting apparatus according to the invention, pure water of 1 ml to be collecting liquid is dipped on the bare wafer, and collecting and scanning are made according to a procedure described above according to the invention. For a scan, the same location is scanned three times by rotating both the bare wafer and the scanning plate at 3 rpm per minute. After scanning, the collecting liquid is withdrawn and the density is measured using ICP-MS. As a result, the result that Fe exists by $9.7\times10^{11}$ atoms/cm$^2$ and Al exists by $1.0\times10^{12}$ atoms/cm$^2$ is acquired, and Fe and Al can be collected at the stable ratio of collecting of 97% or more. In case the similar experiment is made by a method of manually collecting, the ratio of collecting disperses from 85% to 97% and the stable ratio of collecting as in the invention cannot be acquired.

Next, a second concrete example of this embodiment will be described. First, a thermal oxide film is formed on the surface of a bare wafer having a diameter of 300 mm so that the thickness is 10 nm and the surface is forcedly contaminated by Cu by spin coating so that the Cu includes $1\times10^{12}$ atoms/cm$^2$. In case the bare wafer is inspected, first as in the conventional type, the thermal oxide film on the bare wafer and Cu of metal impurities existing on the surface are dissolved (the VPD process) by the vapor of HF and the surface of the bare wafer is turned hydrophobic. Next, the bare wafer is laid on the collecting apparatus according to the invention, solution which is collecting liquid and which is acquired by mixing HF of 1% and $H_2O_2$ of 5% is dripped on the bare wafer by 1 ml and collecting and scanning are made according to the procedure according to the invention. For collecting, the same location is scanned once by rotating both the bare wafer and the scanning plate at 1 rpm per minute. After scanning, the collecting liquid is withdrawn and the density is measured using ICP-MS. As a result, it proves that the density of Cu is $9.0\times10^{11}$ atoms/cm$^2$ and Cu is collected at the ratio of collecting of 90% or more. When the similar experiment is made using the conventional type apparatus (according to spiral scanning) and collecting liquid is withdrawn, it proves that the density of Cu is $8.5\times10^{11}$ atoms/cm$^2$ and the Cu is collected at the ratio of collecting of 85% or more. In the case of the conventional type apparatus, the same location can be scanned only once, in addition, it takes much time to collect because it takes ten minutes per one wafer, therefore, the collecting liquid is vaporized, the amount decrease-and it is considered that they have a bad effect upon the ratio of collecting and the measured density.

In the conventional type impurities collecting apparatus, in case the same position on a semiconductor wafer having a diameter of 300 mm is scanned once, it takes approximately ten minutes at the soonest and only the throughput of six wafers per hour at the maximum is acquired. In the meantime, according to the impurities collecting method according to the invention, even if only the semiconductor wafer is rotated at 1 rpm and the surface of the semiconductor wafer is scanned once, the process is finished in one minute, 60 wafers per hour at the maximum can be processed and as ten times throughput as that of the conventional type can be acquired. Even if the size of a semiconductor wafer is changed, the impurities collecting method according to the invention can correspond to different sizes if some types of scanning plates different in length are prepared and in addition, independent of the size of a semiconductor wafer, the semiconductor wafer can be withdrawn at the same processing time. As described above, the invention can also correspond to a semiconductor wafer having a large diameter, as time required for collecting metal impurities is reduced, contamination by ambient atmosphere and the vaporization of the collecting liquid are prevented and as the ratio of collecting is enhanced, the quality of the device can be enhanced.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A method of collecting impurities existing on the surface of a semiconductor wafer and in a thin film formed on the semiconductor wafer, comprising:

dripping collecting liquid on the surface of the semiconductor wafer to which hydrophobic processing is applied;

elongating the collecting liquid which is dripped and is turned spherical by surface tension in the radial direction of the semiconductor wafer in a state in which the surface tension is maintained;

rolling and scanning the elongated collecting liquid, over the surface of the semiconductor wafer and incorporating impurities into the collecting liquid;

restoring the elongated collecting liquid to the original spherical shape after the impurities are incorporated; and withdrawing the collecting liquid restored to the spherical shape from the surface of the semiconductor wafer.

2. A method of collecting impurities on the surface of a semiconductor wafer according to claim 1, wherein:

the collecting liquid is dripped in a substantially intermediate position of the radius of the semiconductor wafer using a syringe.

3. A method of collecting impurities on the surface of a semiconductor wafer according to claim 1, wherein:

in the elongating the collecting liquid is dripped on the surface of the semiconductor wafer, a scanning plate having the length equivalent to the length of the radius or slightly longer is pressed from the site on the collecting liquid dripped and turned spherical, the plate, being rotated and the collecting liquid is elongated along a boundary between the scanning plate and the surface of the semiconductor wafer utilizing surface tension.

4. A method of collecting impurities on the surface of a semiconductor wafer according to claim 3, wherein:

the collecting liquid is elongated in the length of the radius from the center of the semiconductor wafer to the edge.

5. A method of collecting impurities on the surface of a semiconductor wafer according to claim 3, wherein:

the scanning plate is rotated and scanned via slight clearance to the extent that the scanning plate is not touched to the surface of the semiconductor wafer.

6. A method of collecting impurities on the surface of a semiconductor wafer according to claim 1, wherein:

in the rolling and scanning the elongated collecting liquid, over the surface of the semiconductor wafer and incorporating impurities, the collecting liquid scans the whole surface of the semiconductor wafer with one end of the elongated collecting liquid being at the rotational center.

7. A method of collecting impurities on the surface of a semiconductor wafer according to claim 1, wherein:

impurities are incorporated by rotating at least either of the semiconductor wafer or a scanning plate.

8. A method of collecting impurities on the surface of a semiconductor wafer according to claim 1, wherein:

after restoring the elongated collecting liquid to the original spherical shape after scanning is finished, a scanning plate is separated from the collecting liquid by lifting the scanning plate on the side of the edge of the semiconductor wafer and gradually increasing an angle between the scanning plate and the surface of the semiconductor wafer and the collecting liquid is moved on the side of the center of the semiconductor wafer, restoring the shape of the collecting liquid to the original spherical shape by surface tension.

9. A method of collecting impurities on the surface of a semiconductor wafer according to claim 1, wherein:

the collecting liquid restored to the spherical shape is attracted and withdrawn by a syringe.

* * * * *